(12) United States Patent
Xie et al.

(10) Patent No.: US 11,296,129 B2
(45) Date of Patent: Apr. 5, 2022

(54) DISPLAY PANEL AND FABRICATING METHOD THEREOF

(71) Applicant: SHENZHEN CHINA STAR OPTOELECTRONICS TECHNOLOGY CO., LTD., Guangdong (CN)

(72) Inventors: Feifei Xie, Guangdong (CN); Zeqin Liu, Guangdong (CN); Kecheng Xie, Guangdong (CN)

(73) Assignee: SHENZHEN CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 248 days.

(21) Appl. No.: 16/608,512

(22) PCT Filed: Aug. 7, 2019

(86) PCT No.: PCT/CN2019/099549
§ 371 (c)(1),
(2) Date: Oct. 25, 2019

(87) PCT Pub. No.: WO2020/258452
PCT Pub. Date: Dec. 30, 2020

(65) Prior Publication Data
US 2021/0335845 A1 Oct. 28, 2021

(30) Foreign Application Priority Data
Jun. 24, 2019 (CN) .......................... 201910548225.3

(51) Int. Cl.
*H01L 27/12* (2006.01)
*G02F 1/1333* (2006.01)
(Continued)

(52) U.S. Cl.
CPC ........ *H01L 27/1248* (2013.01); *G02F 1/1339* (2013.01); *G02F 1/133345* (2013.01); *H01L 27/1259* (2013.01); *G02F 1/1368* (2013.01)

(58) Field of Classification Search
CPC ............. H01L 27/1248; H01L 27/1259; H01L 27/3276; H01L 27/3246; H01L 27/3244;
(Continued)

(56) References Cited

U.S. PATENT DOCUMENTS 10,312,298 B2 * 6/2019 Oh ......................... H01L 51/56
2016/0109747 A1 4/2016 Nodera et al.
2018/0033829 A1 * 2/2018 Oh ........................ H01L 27/323

FOREIGN PATENT DOCUMENTS

| CN | 105247408 A | 1/2016 |
|---|---|---|
| CN | 109143689 A | 1/2019 |
| WO | 2016157399 A1 | 10/2016 |

* cited by examiner

*Primary Examiner* — Nikolay K Yushin

(57) ABSTRACT

This invention provides a display panel and a fabricating method thereof. Wherein the display panel defines a display area and an edge area. The display panel includes a substrate, a gate layer, a gate insulating layer, a thin film encapsulation layer, and a polyimide layer. By disposing a buffer tank on the gate insulating layer, the flow rate of the polyimide solution printed through inkjet printing in the edge region is reduced when the polyimide layer is forming, thereby causing it to solidify to form the polyimide layer before flowing over a retaining wall, and preventing sealant contamination and peeling.

9 Claims, 2 Drawing Sheets

(51) Int. Cl.
*G02F 1/1339* (2006.01)
*G02F 1/1368* (2006.01)

(58) Field of Classification Search
CPC ............. G02F 1/133345; G02F 1/1339; G02F 1/1368; G02F 1/133351
See application file for complete search history.

DISPLAY PANEL AND FABRICATING METHOD THEREOF

FIELD OF INVENTION

This invention relates to the field of display technologies, and, in particular, to a display panel and a fabricating method thereof.

BACKGROUND OF INVENTION

With development of liquid crystal display (LCD), ultra-narrow border design has gradually become a mainstream product. However, ultra-narrow border has higher requirements for panel design and manufacturing. Its display area is closer to edge of glass substrate, and sealant of ultra-narrow border is relatively moved inward, which demands higher polyimide coating requirements.

Technical Problems

Ink-jet printing is one of the commonly used processes for polyimide coating. However, due to the good fluidity of polyimide (PI) solution, it is not easy to control its boundary. Therefore, a retaining wall is usually used on the periphery of the display area in designs in the industry to prevent the polyimide from reflowing and forming uncontrollable boundaries during the coating process. To a certain extent, PI solution reflowing and overflowing still happen in these designs, which cause the PI solution to overflow the retaining wall and leads to sealant contamination and peeling, affecting narrow border designs.

Therefore, it is necessary to provide a new display panel and a fabricating method thereof to overcome the problems in the prior art.

SUMMARY OF INVENTION

An object of the present invention is to provide a display panel and a fabricating method thereof, which can solve the problems that PI solution reflows and overflows in the prior art, causes the PI solution to flow over the retaining wall and leads to sealant contamination and peeling, and the invention facilitates the implementation of a narrow border design.

In order to solve the above problems, an embodiment of this invention provides a display panel, the display panel defines a display area and an edge area; the display panel includes a substrate, a gate layer, a gate insulating layer, a thin film encapsulation layer, and a polyimide layer. Wherein the gate layer is disposed on the substrate; the gate insulating layer is disposed on the gate layer; the thin film encapsulation layer is disposed on the gate insulating layer; the polyimide layer is disposed on the thin film encapsulation layer; wherein a buffer tank is disposed on the gate insulating layer and recessed downward at a position in the edge area, and wherein the thin film encapsulation layer and the polyimide layer disposed on the thin film encapsulation layer fill down into the buffer tank.

Further, the buffer tank corresponding to the gate layer is disposed on the gate insulating layer.

Further, a shape of the buffer tank includes one or more of the following: a rectangular shape, an arc shape, a wave shape, and a zigzag shape.

Further, the number of the buffer tank is one.

Further, the number of the buffer tank is two or more than two.

Further, the display panel includes a sealant disposed on the thin film encapsulation layer in the edge area that is away from the display area.

Further, the display panel includes a first retaining wall disposed on the gate insulating layer on one side of the sealant that is away from the display area.

Further, the display panel includes a second retaining wall disposed on the gate insulating layer between the buffer tank and the sealant.

Another embodiment of the present invention further provides a method of fabricating the display panel of the invention, the method includes the steps of: step S1: providing a substrate and defining a display area and an edge area of the display panel to be fabricated; step S2: forming a gate layer on the substrate; step S3: forming a gate insulating layer on the gate layer, wherein a buffer tank is disposed on the gate insulating layer and recessed downward at a position in the edge area; step S4: forming a thin film encapsulation layer on the gate insulating layer; and step S5: coating a polyimide solution on the thin film encapsulation layer by an inkjet printing device and solidifying to form a polyimide layer; wherein the thin film encapsulation layer and the polyimide layer fill down into the buffer tank.

Further, the buffer tank is formed by a mask etching method.

Beneficial Effect

The invention relates to a display panel and a fabricating method thereof. By disposing a buffer tank on the gate insulating layer, the flow rate of the polyimide solution printed through inkjet printing in the edge region is greatly reduced when the polyimide layer is forming, thereby causing it to solidify to form the polyimide layer before flowing over the retaining wall, and preventing sealant contamination and peeling, so that the distance between the edge of the display area and the retaining wall can be reduced, that is, the width of the edge area can be designed to be narrower, which facilitates the implementation of a narrow border design.

DESCRIPTION OF DRAWINGS

In order to more clearly illustrate the technical solutions in the embodiments of the present invention, the drawings which are used in the description of the embodiments will be briefly described below. It is obvious that the drawings in the following description are only some embodiments of the present invention. Other drawings can also be obtained from those skilled in the art without paying any creative effort.

Figure 1:
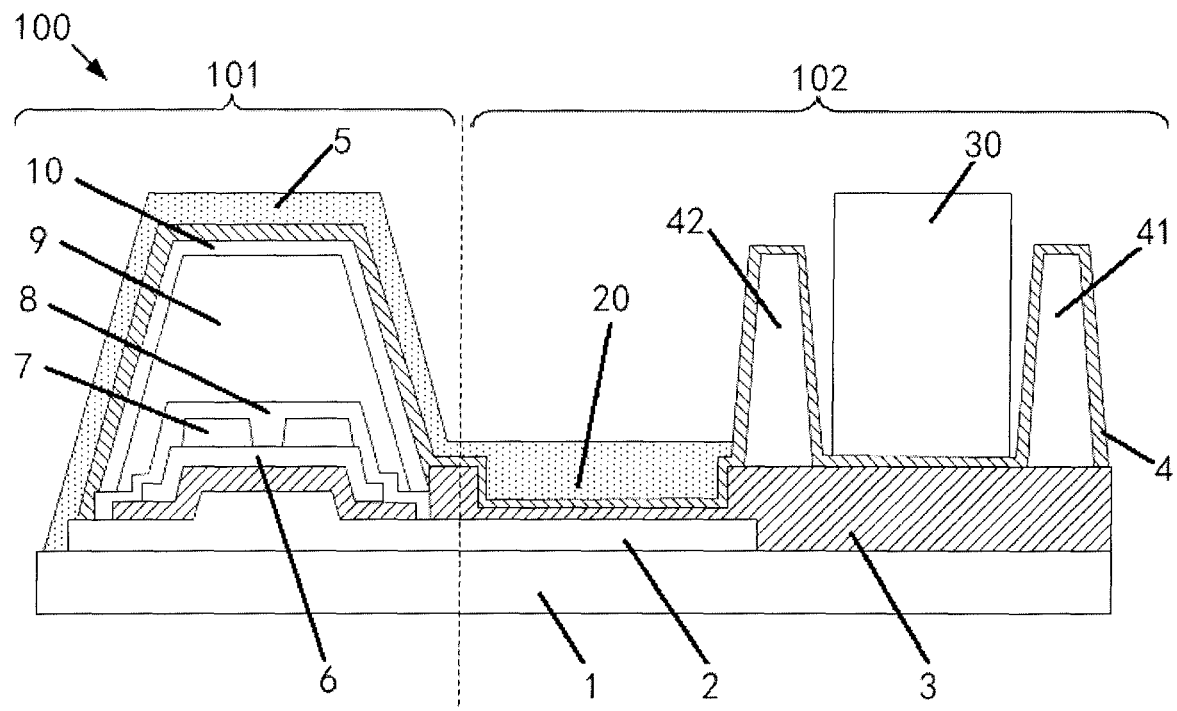
FIG. 1 is a schematic structural view of a display panel in a first embodiment of the present invention.

Reference numbers of the parts in the figures are as follows:
100 display panel
101 display area
102 edge area
1 substrate
2 gate layer
3 gate insulating layer
4 thin film encapsulation layer 5 polyimide layer
6 active layer
7 source and drain layer
8 passivation layer
9 color resist layer
10 indium tin oxide layer
20 buffer tank
30 sealant
41 first retaining wall
42 second retaining wall

DETAILED DESCRIPTION OF PREFERRED EMBODIMENTS

Preferred embodiments of the present invention with reference to the accompanying drawings are described below to illustrate that the invention can be practiced. These embodiments can fully introduce the technical content of the present invention to those skilled in the art, so that the technical content of the present invention is clearer and easier to be understood. However, the invention may be embodied in many different forms of embodiments, the scope of the invention is not limited to the embodiments mentioned herein, and the following description of the embodiments is not intended to limit the scope of the invention.

The directional terms mentioned in the present invention, such as up, down, front, back, left, right, inside, outside, side, etc., are only directions in the drawings, the directional terms used herein are used to explain and explain this invention, and they are not intended to limit the scope of the invention.

In the drawings, the components having similar structures are denoted by the same numerals. The structures and the components having similar function are denoted by similar numerals. In addition, to facilitate understanding and description, thickness and size of each of the components of the drawings are randomly shown, and the present disclosure does not limit thickness and size of each of the components.

When a first component is described as "on" a second component, the first component can be placed directly on the second component; there can also be an intermediate component, the first component is placed on the intermediate component, and the intermediate component is placed on the second component. When the first component is described as "installed on the second component" or "connected to the second component", it should be understood as that the first component is directly installed on the second component or the first component is directly connected to the second component, or it should be understood as that the first component is indirectly installed on the second component via the intermediate component or the first component is indirectly connected to the second component via the intermediate component.

Embodiment 1

As shown in FIG. 1, the first embodiment of the present invention provides a display panel 100, the display panel 100 defines a display area 101 and an edge area 102, the display panel 100 includes a substrate 1, a gate layer 2, a gate insulating layer 3, a thin film encapsulation layer 4, and a polyimide layer 5 in the order from bottom to top. Wherein a buffer tank 20 is disposed on the gate insulating layer 3 and recessed downward at a position in the edge area 102, and wherein the thin film encapsulation layer 4 and the polyimide layer 5 disposed on the thin film encapsulation layer 4 fill down into the buffer tank 20. Wherein the buffer tank 20 can be used to reduce the flow rate of the polyimide solution used for forming the polyimide layer 5 in the edge area 102.

As shown in FIG. 1, in this embodiment, the gate layer 2 extends from the display area 101 to the edge area 102, and the buffer tank 20 corresponding to the gate layer 2 in the edge area 102 is disposed on the gate insulating layer 3. In other words, the gate layer 2 is used as a driving circuit, a portion of the gate layer 2 is disposed in the display area 101, a portion of the gate layer 2 is disposed in the edge area 102, and the buffer tank 20 is disposed at a position that corresponds to the gate layer 2 in the edge area 102.

As shown in FIG. 1, wherein a shape of the buffer tank 20 includes one or more of the following: a rectangular shape, an arc shape, a wave shape, and a zigzag shape. It should be noted that the shape of the buffer tank 20 is not limited to the abovementioned shapes.

As shown in FIG. 1, the shape of the buffer tank 20 is a rectangular shape, and the number of the buffer tank is one. The buffer tank 20 can be used to reduce the flow rate of the polyimide solution used for forming the polyimide layer 5 in the edge area 102.

As shown in FIG. 1, wherein the display panel 100 in the display area 101 includes the substrate 1, the gate layer 2, the gate insulating layer 3, an active layer 6, a source and drain layer 7, a passivation layer 8, a color resist layer 9, an indium tin oxide layer 10, the thin film encapsulation layer 4, and the polyimide layer 5 in the order from bottom to top. It should be noted that the structure of the display area 101 is prior art, and a more detailed structure thereof will not be described herein.

As shown in FIG. 1, the display panel 100 further includes a sealant 30. The sealant 30 is disposed on the thin film encapsulation layer 4 in the edge area 102 that is away from the display area 101.

As shown in FIG. 1, the display panel 100 further includes a first retaining wall 41. The first retaining wall 41 is disposed on the gate insulating layer 3 on one side of the sealant 30 that is away from the display area 101.

As shown in FIG. 1, the display panel 100 further includes a second retaining wall 42. The second retaining wall 42 is disposed on the gate insulating layer 3 that is between the buffer tank 20 and the sealant 30.

In the present embodiment, by disposing the buffer tank 20 on the gate insulating layer 3, the flow rate of the polyimide solution printed through inkjet printing in the edge region 102 is greatly reduced when the polyimide layer 5 is forming, thereby causing it to solidify to form the polyimide layer 5 before flowing over the second retaining wall 42, thereby preventing the sealant 30 from contamination and peeling, so that the distance between the edge of the display area 101 and the second retaining wall 42 can be reduced, that is, the width of the edge area 102 can be designed to be narrower, which facilitates the implementation of a narrow border design.

Embodiment 2

Figure 2:
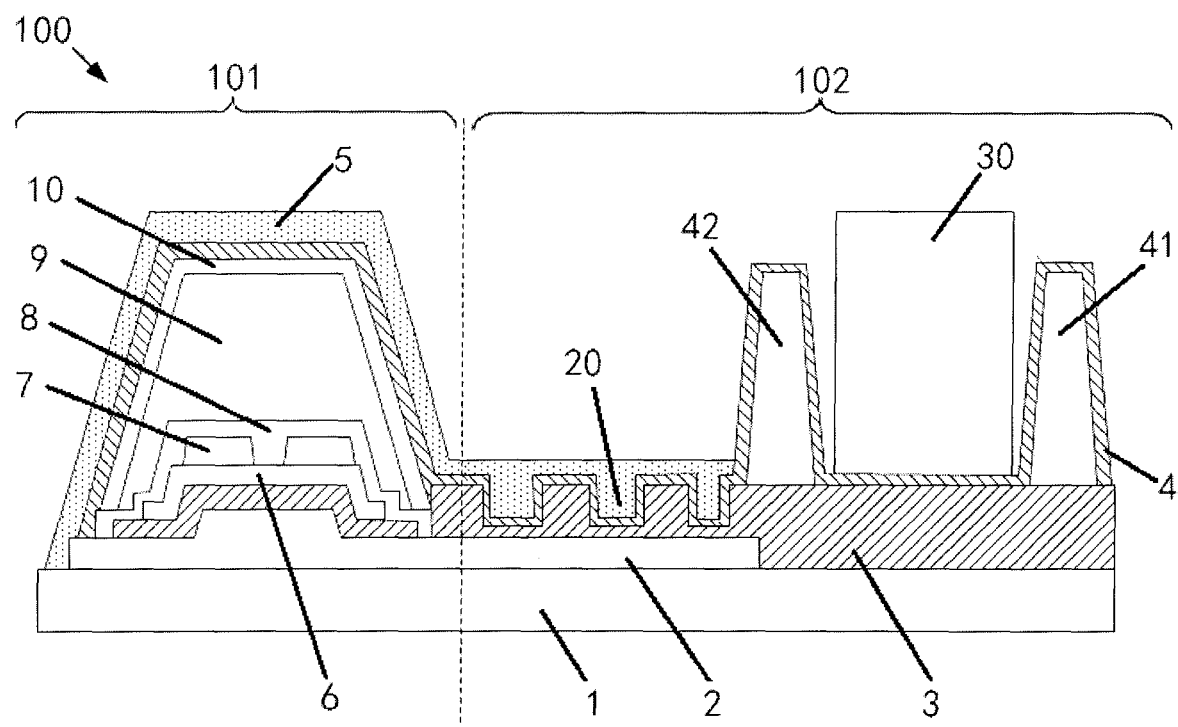
FIG. 2 is a schematic structural view of a display panel in a second embodiment of the present invention.

As shown in FIG. 2, all the technical features in the first embodiment are included in the second embodiment. The differences between the two embodiments are that the buffer tank 20 in the second embodiment is rectangular, and the number of the buffer tank 20 is two or more than two instead of the number being one in the first embodiment. The flow of the polyimide solution used for forming the polyimide layer 5 in the edge region 102 can be intercepted multiple times by increasing the number of the buffer tank 20, thereby reducing the flow rate of the polyimide solution.

Embodiment 3

Figure 3:
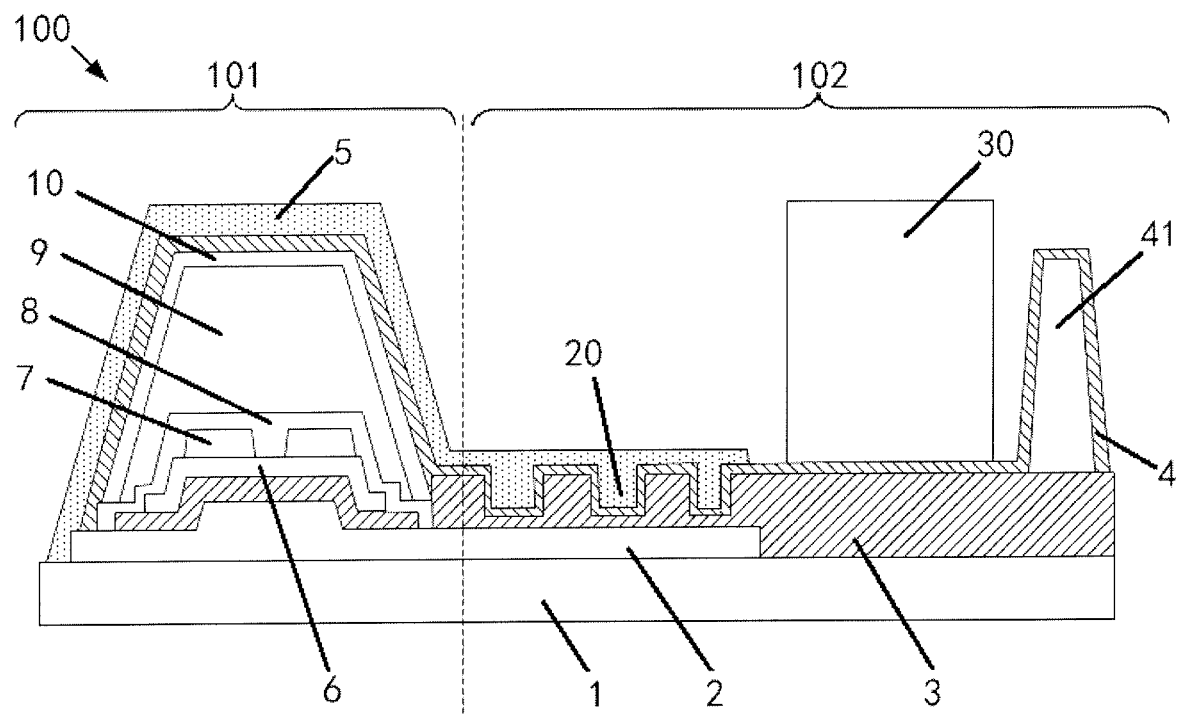
FIG. 3 is a schematic structural view of a display panel in a third embodiment of the present invention.

As shown in FIG. 3, all the technical features in the second embodiment are included in the third embodiment. The difference between the two embodiments is that the display panel 100 includes only the first retaining wall 41 in the third embodiment. This arrangement is based on the premise that the buffer tank 20 is sufficient to prevent the contamination of the sealant 30 caused by the overflowing and reflowing of the polyimide solution, and the third embodiment can eliminate the second retaining wall 42 and optimize the process.

Figure 4:
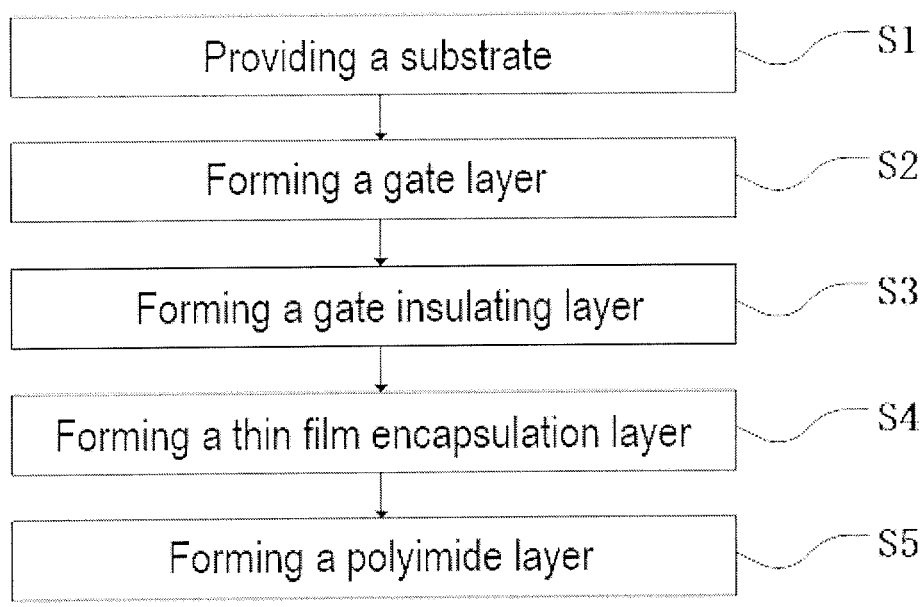
FIG. 4 is a flow chart showing a method of fabricating the display panel of the present invention.

As shown in FIG. 4, another embodiment of the present invention provides a method of fabricating the display panel 100, the method includes the steps of:

S1: providing a substrate 1, and defining a display area 101 and an edge area 102 of the display panel 100 to be fabricated.

S2: forming a gate layer 2. A gate layer 2 is formed on the substrate.

S3: forming a gate insulating layer 3. A gate insulating layer 3 is formed on the gate layer 2, wherein a buffer tank 20 is disposed on the gate insulating layer 3 and recessed downward at a position in the edge area 102.

S4: forming a thin film encapsulation layer 4. A thin film encapsulation layer 4 is formed on the gate insulating layer 3. And S5: forming a polyimide layer 5. A polyimide solution 5 is coated on the thin film encapsulation layer 4 by an inkjet printing device and solidified to form a polyimide layer 5.

The thin film encapsulation layer 4 and the polyimide layer 5 fill down into the buffer tank 20. The buffer tank 20 is used to reduce the flow rate of the polyimide solution in the edge area 102.

In the embodiment, the buffer tank 20 is formed by a mask etching method.

In the present embodiment, by disposing the buffer tank 20 on the gate insulating layer 3, the flow rate of the polyimide solution printed through inkjet printing in the edge region 102 is greatly reduced when the polyimide layer 5 is forming, thereby causing it to solidify to form the polyimide layer 5 before flowing over the sealant 30, thereby preventing the sealant 30 from contamination and peeling, so that the distance between the edge of the display area 101 and the sealant 30 can be reduced, that is, the width of the edge area 102 can be designed to be narrower, which facilitates the implementation of a narrow border design.

The display panel and the method of fabricating the same provided by the present invention have been described in detail above. It should be understood that the exemplary embodiments described herein are to be considered as illustrative only, they are used to help to understand the method of the present invention and its core ideas, and they are not intended to limit the invention. Descriptions of features or aspects in each exemplary embodiment are generally considered to be applicable to similar features or aspects in other exemplary embodiments. While the invention has been described with reference to the preferred embodiments thereof, various modifications and changes can be made by those skilled in the art. The present invention is intended to cover such modifications and variations within the scope of the appended claims, and all modifications, equivalents, and improvements, etc. within the spirit and scope of the invention are intended to be included within the scope of the present invention.

What is claimed is:

1. A display panel, the display panel defining a display area and an edge area, the display panel comprising:
    a substrate;
    a gate layer disposed on the substrate;
    a gate insulating layer disposed on the gate layer;
    a thin film encapsulation layer disposed on the gate insulating layer; and
    a polyimide layer disposed on the thin film encapsulation layer;
    wherein a buffer tank is disposed on the gate insulating layer and recessed downward at a position in the edge area, wherein the thin film encapsulation layer and the polyimide layer disposed on the thin film encapsulation layer fill down into the buffer tank, and wherein the buffer tank corresponding to the gate layer is disposed on the gate insulating layer.

2. The display panel as claimed in claim 1, wherein a shape of the buffer tank includes one or more of the following: a rectangular shape, an arc shape, a wave shape, and a zigzag shape.

3. The display panel as claimed in claim 2, wherein the number of the buffer tank is one.

4. The display panel as claimed in claim 2, wherein the number of the buffer tank is two or more than two.

5. The display panel as claimed in claim 1, further comprising a sealant disposed on the thin film encapsulation layer in the edge area that is away from the display area.

6. The display panel as claimed in claim 5, further comprising a first retaining wall disposed on the gate insulating layer on one side of the sealant that is away from the display area.

7. The display panel as claimed in claim 5, further comprising a second retaining wall disposed on the gate insulating layer between the buffer tank and the sealant.

8. A method of fabricating the display panel as claimed in claim 1, comprising the steps of:
    step S1: providing a substrate and defining a display area and an edge area of the display panel to be fabricated;
    step S2: forming a gate layer on the substrate;
    step S3: forming a gate insulating layer on the gate layer, wherein a buffer tank is disposed on the gate insulating layer and recessed downward at a position in the edge area;
    step S4: forming a thin film encapsulation layer on the gate insulating layer; and
    step S5: coating a polyimide solution on the thin film encapsulation layer by an inkjet printing device and solidifying to form a polyimide layer;
    wherein the thin film encapsulation layer and the polyimide layer fill down into the buffer tank.

9. The method as claimed in claim 8, wherein the buffer tank is formed by a mask etching method.

* * * * *